(12) United States Patent
Murakami et al.

(10) Patent No.: US 7,639,538 B2
(45) Date of Patent: Dec. 29, 2009

(54) MEMORY CARD, SEMICONDUCTOR DEVICE, AND METHOD OF CONTROLLING MEMORY CARD

(75) Inventors: Tetsuya Murakami, Komae (JP); Takashi Oshima, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/102,649

(22) Filed: Apr. 14, 2008

(65) Prior Publication Data

US 2008/0198658 A1 Aug. 21, 2008

Related U.S. Application Data

(63) Continuation of application No. 11/079,250, filed on Mar. 15, 2005, now Pat. No. 7,379,334.

(30) Foreign Application Priority Data

Oct. 25, 2004 (JP) ............... 2004-309751

(51) Int. Cl.
*G11C 16/04* (2006.01)
(52) U.S. Cl. ................ 365/185.17; 365/52; 365/185.33
(58) Field of Classification Search ............ 365/185.17, 365/51–52, 63, 94, 185.33
See application file for complete search history.

(56) References Cited

U.S. PATENT DOCUMENTS

| | | | |
|---|---|---|---|
| 6,226,202 B1 | 5/2001 | Kikuchi | |
| 6,450,407 B1* | 9/2002 | Freeman et al. | 235/492 |
| 6,498,750 B2* | 12/2002 | Terada | 365/185.11 |
| 6,588,010 B1* | 7/2003 | Ogata | 717/169 |
| 6,711,059 B2 | 3/2004 | Sinclair et al. | |
| 6,817,015 B2* | 11/2004 | Takata | 717/168 |
| 7,174,537 B2 | 2/2007 | Ito | |
| 7,379,334 B2* | 5/2008 | Murakami et al. | 365/185.17 |
| 2001/0054148 A1* | 12/2001 | Hoornaert et al. | 713/172 |
| 2002/0080276 A1 | 6/2002 | Mori et al. | |
| 2003/0227645 A1 | 12/2003 | Hisatomi et al. | |
| 2006/0126422 A1 | 6/2006 | Takagi et al. | |
| 2006/0158690 A1* | 7/2006 | Willman | 358/1.16 |

FOREIGN PATENT DOCUMENTS

| | | |
|---|---|---|
| JP | 11-265283 | 9/1999 |
| JP | 2001-43206 | 2/2001 |
| JP | 2001-344148 | 12/2001 |
| JP | 2003-76605 | 3/2003 |
| WO | WO 98/03915 | 1/1998 |

\* cited by examiner

*Primary Examiner*—Gene N. Auduong
(74) *Attorney, Agent, or Firm*—Oblon, Spivak, McClelland, Maier & Neustadt, L.L.P.

(57) ABSTRACT

A semiconductor device includes a transfer section which receives, from an external source, a second program for modifying a function of a first program stored in a read-only memory (ROM) and information required in activation of the second program, and which writes the program and the information to a nonvolatile semiconductor memory, and a load section which activates the second program on the basis of the information written to the nonvolatile semiconductor memory to modify the function of the first program.

20 Claims, 17 Drawing Sheets

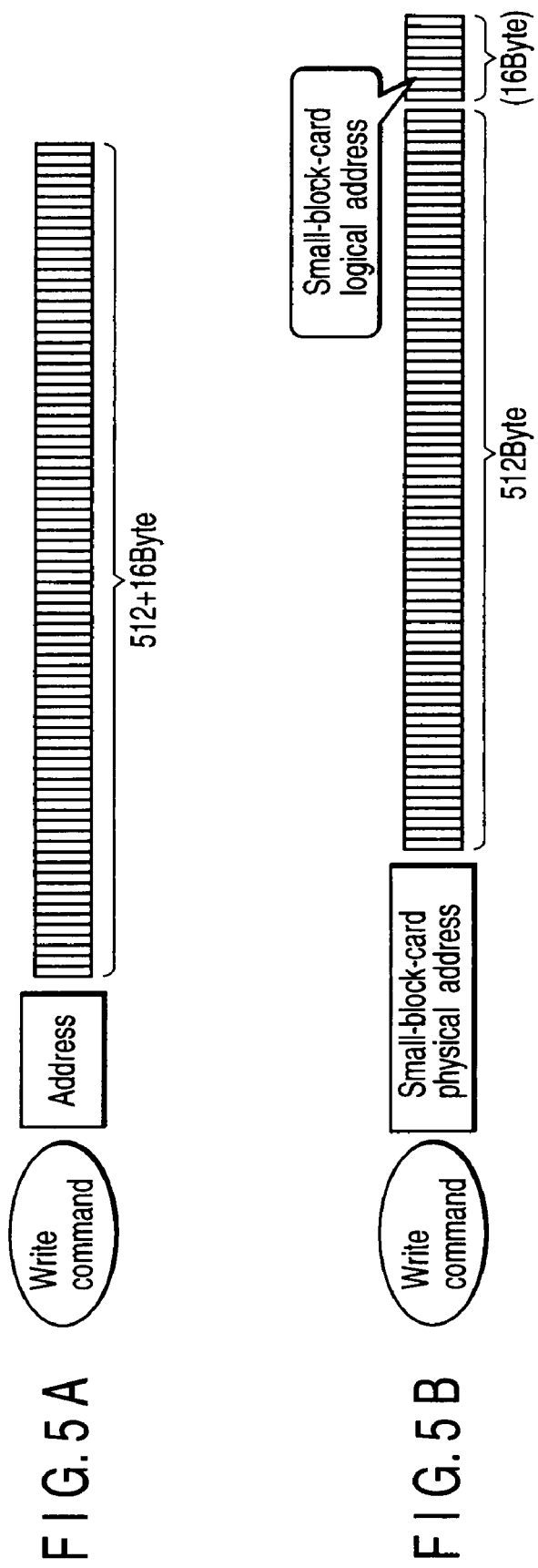
F I G. 5 A
F I G. 5 B

Block format

| | 512-byte data in host block Page 0 | ECC0 | 512-byte data in host block Page 1 | ECC1 | 512-byte data in host block Page 2 | ECC2 | 512-byte data in host block Page 3 | Management data | ECC3 |
|---|---|---|---|---|---|---|---|---|---|
| page 0 | 512Byte 0~511 | 10Byte 512~521 | 512Byte 522~1033 | 10Byte 1034~1043 | 512Byte 1044~1555 | 10Byte 1556~1565 | 512Byte 1566~2077 | 24Byte 2078~2101 | 10Byte 2101~2111 |
| page 7 | 512Byte | 10Byte | 512Byte | 10Byte | 512Byte | 10Byte | 512Byte | 24Byte | 10Byte |
| page 8 | 512Byte | 10Byte | 512Byte | 10Byte | 512Byte | 10Byte | 512Byte | 24Byte | 10Byte |
| page 15 | 512Byte | 10Byte | 512Byte | 10Byte | 512Byte | 10Byte | 512Byte | 24Byte | 10Byte |
| page 120 | 512Byte | 10Byte | 512Byte | 10Byte | 512Byte | 10Byte | 512Byte | 24Byte | 10Byte |
| page 127 | 512Byte | 10Byte | 512Byte | 10Byte | 512Byte | 10Byte | 512Byte | 24Byte | 10Byte |

Host managed (16 kByte) block 0: pages 0–7
Host managed (16 kByte) block 1: pages 8–15
Host managed (16 kByte) block 15: pages 120–127
One physical block (256 kByte)

| | Description | | | Number of bytes |
|---|---|---|---|---|
| CIS | CIS data | | | 512B |
| CIS-PBA | Holds xPBA of CIS | | | 2B(10bit) |
| Recognition number | Identification number; during read, signature area is returned with AA55h fixed | | | 512B |
| ID | Type of data written in page and bad block attribute | | | 1B |
| | bit7-6 | BLK Status | | |
| | | 0x00 | Bad Block | |
| | | 0x01 | Pair BLK, Reserved pair BLK | |
| | | 0x10 | Spare's spare BLK | |
| | | 0x11 | Logical assigned BLK, Spare BLK | |
| | bit5-0 | BLK ID | | |
| | | 0x3e | CIS | |
| | | 0x3d | Management page 0 | |
| | | 0x3b | Management page 1 | |
| | | 0x37 | Management page 2 | |
| | | 0x2f | Management page 3 | |
| | | 0x3c | Data page 0 | |
| | | 0x39 | Data page 1 | |
| | | 0x33 | Data page 2 | |
| Empty BLK | Store PBAs of arbitrary eight erased blocks | | | 13B(8x13bit) |
| ECC | ECCs corresponding to column addressed 0 to 517, 528 to 1045, 1056 to 1573, and 1584 to 2101 | | | 10B |
| Assign & Status | Uses 1 byte to indicate zone to which block is assigned and status of block Management blocks are not rewritten for each held block erasure, so that data may have been erased from block even if block is assigned to any zone | | | 8192B |
| | bit7-6 | Same as status ID of block | | |
| | bit5-0 | Higher 6 bits of zone number (7 bits) in data stored in block | | |

F I G. 13

MEMORY CARD, SEMICONDUCTOR DEVICE, AND METHOD OF CONTROLLING MEMORY CARD

CROSS-REFERENCE TO RELATED APPLICATIONS

This application is a continuation of U.S. application Ser. No. 11/079,250, filed Mar. 15, 2005, now U.S. Pat. No. 7,379,334, and is based upon and claims the benefit of priority from prior Japanese Patent Application No. 2004-309751, filed Oct. 25, 2004, the entire contents of both of which are incorporated herein by reference.

BACKGROUND OF THE INVENTION

1. Field of the Invention

The present invention relates to a memory card in which a nonvolatile semiconductor memory is mounted, and in particular, to a memory card in which a nonvolatile semiconductor memory having a particular erase block size is mounted, a semiconductor device mounted in the memory card, and a method of controlling the memory card.

2. Description of the Related Art

Some of various memory cards comprise a NAND nonvolatile semiconductor memory and a controller. The controller includes a CPU that carries out a protocol conversion and the like, a read-only memory (ROM) that stores firmware used by the CPU, and a RAM used as a work area for the CPU.

For example, after firmware under development has completed and a manufacturing process has made certain progress in preparation for shipment, there may be a need for modifying the firmware (e.g., changing or adding functions of the firmware) to resolve possible problems or improve the firmware. In such a case, the ROM in the controller must be replaced with a new one. This increase the amount of time before the memory card can be shipped as well as costs. Further, after the memory card has been shipped, it is difficult to replace the ROM.

There are various techniques for modifying programs or the like stored in the memory. For example, Jpn. Pat. Appln. KOKAI Publication No. 2001-43206 (FIG. 1, paragraph 0038) discloses a memory card comprising a ROM that stores firmware for rewriting programs on a flash memory and an interrupt vector specifying the address of a control program for operations of a CSI (a communication device that for example, receives rewrite data from a host). This document also discloses that, in a rewrite mode, an interrupt request signal input by the CSI to an interrupt controller is given top priority in notification to the CPU in order to execute a rewrite.

According to this document, it is possible to modify a program on the flash memory. However, it is impossible to modify functions of a program stored in the ROM.

It is thus desired to be able to efficiently modify functions of the programs stored in the ROM.

BRIEF SUMMARY OF THE INVENTION

A semiconductor device according to an embodiment of the present invention comprises a transfer section which receives, from an external source, a second program for modifying a function of a first program stored in a read-only memory (ROM) and information required in activation of the second program, and which writes the program and the information to a nonvolatile semiconductor memory; and a load section which activates the second program on the basis of the information written to the nonvolatile semiconductor memory to modify the function of the first program.

A memory card according to an embodiment of the present invention comprises a read-only memory (ROM) which stores a first program; a nonvolatile semiconductor memory; a transfer section which receives, from an external source, a second program for modifying a function of the first program and information required in activation of the second program, and which writes the program and the information to the nonvolatile semiconductor memory; and a load section which activates the second program on the basis of the information written to the nonvolatile semiconductor memory to modify the function of the first program.

A method of controlling a memory card including a read-only memory (ROM) which stores a first program and a nonvolatile semiconductor memory, according to an embodiment of the present invention, comprises writing a second program for modifying a function of the first program and information required in activation of the second program, to the nonvolatile semiconductor memory; and activating the second program on the basis of the information written to the nonvolatile semiconductor memory to modify the function of the first program.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 5A and 5B are diagrams showing the format of a command sent by the host;

FIG. 7 is a diagram showing the block format of the flash memory in the large block card (for a 256-Kbyte physical block corresponding to an erase unit);

FIG. 8 is a diagram showing a block format different from that in FIG. 7;

FIG. 12 is a diagram showing an example of the format of the central management block shown in FIG. 11;

FIG. 13 is a table illustrating essential parts of the information shown in FIG. 12;

DETAILED DESCRIPTION OF THE INVENTION

Embodiments of the present invention will be described below with reference to the drawings.

Figure 1:
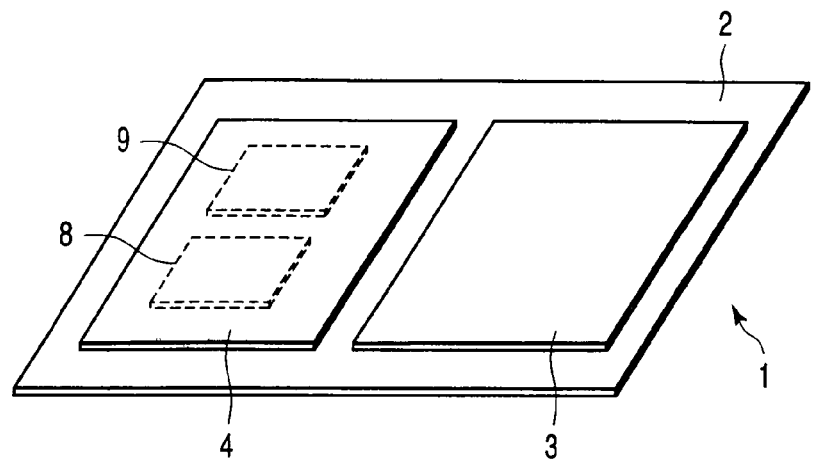
FIG. 1 is a perspective view schematically showing the configuration of a device or the like which is mounted in a memory card according to an embodiment of the present invention.

FIG. 1 is a perspective view schematically showing the configuration of a device or the like which is mounted in a memory card according to an embodiment of the present invention.

As shown in this figure, the memory card 1 according to the present embodiment has a NAND flash memory 3 and a controller 4 arranged on a printed circuit board (PCB) substrate 2. Functional blocks such as a central processing unit (CPU) 8 and a read-only memory (ROM) 9 are mounted in the controller 4. Each of the devices will be described later in detail. The NAND flash memory 3 may be a binary memory in which one-bit information is stored in one memory cell or a multi-valued memory in which information containing more than one bit (for example, 2 bits) is stored in one memory cell. FIG. 1 shows that the NAND flash memory 3 and the controller 4 are arranged on the PCB. However, the NAND flash memory 3 and the controller 4 may be arranged on the same large-scale integration (LSI) circuit board.

The terms "logical block address" and "physical block address, as used herein, mean the logical address and physical address, respectively, of a block itself. Further, the "logical address" and "physical address" principally mean the logical address and physical address of a block itself but indicates that they may be addresses corresponding to a resolution unit smaller than the block unit.

Figure 2:
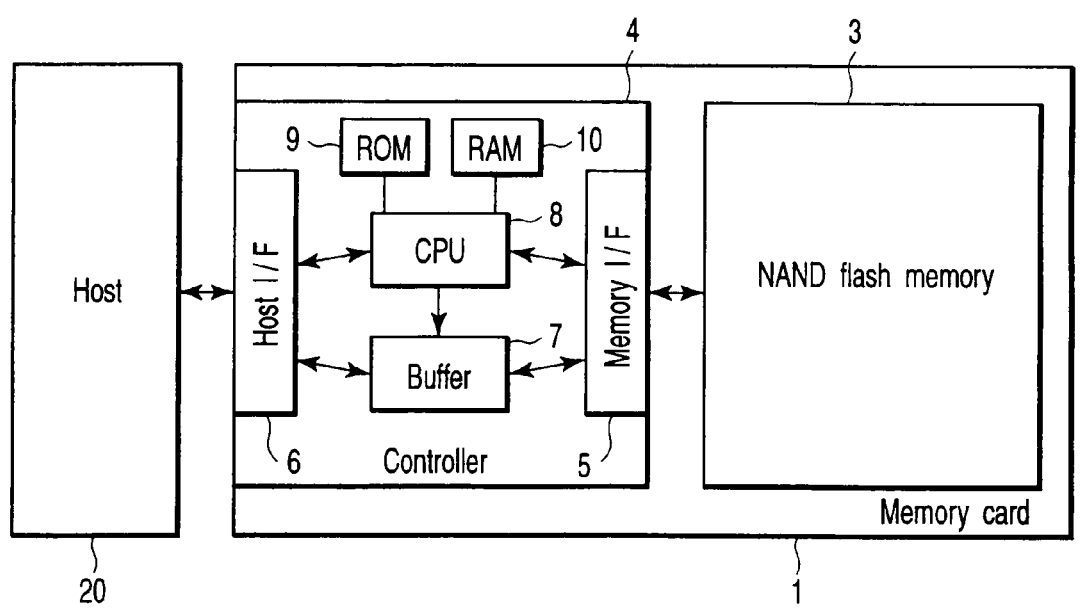
FIG. 2 is a block diagram showing a configuration including a host and the memory card.

FIG. 2 is a block diagram showing a configuration including a host and the memory card. Elements common to FIG. 1 are denoted by the same reference numerals.

A host apparatus (hereinafter referred to as a host) 20 comprises hardware and software (system) required to access a memory card to be connected to the host apparatus. The host 20 is constructed to manage the physical status of the interior of the memory card (which physical block address contains which logical sector address data, or from which block data has already been erased) to directly control the flash memory in the memory card.

Assuming that the NAND flash memory used has an erase block size of 16 Kbytes, the host 20 assigns every 16 Kbytes of logical and physical addresses, and in many cases, sequentially executes write or read accesses on 16 Kbytes of logical addresses (the corresponding commands are issued).

When connected to the host 20, the memory card 1 receives a power supply from the host 20 to operate. The memory card 1 then executes a process corresponding to an access from the host 2. The memory card 1 has the NAND flash memory 3 and the controller 4 as described previously.

The NAND flash memory 3 is a nonvolatile memory for which the erase block size (the block size corresponding to the erase unit) is set at 256 bytes. For example, for each write or read, 16 Kbytes of data is written in or read from the NAND flash memory 3. The NAND flash memory 3 is produced using, for example, a 0.09-μm process technique. That is, the design rule for the NAND flash memory 3 is less than 0.1 μm.

Besides the previously described CPU 8 and ROM 8, the controller 4 is provided with a memory interface section 5, a host interface section 6, a buffer 7, and a random access memory (RAM) 10.

The memory interface section 5 executes an interfacing process between the controller 4 and the NAND flash memory 3. The host interface section 6 executes an interfacing process between the controller 4 and the host 20.

When data sent by the host 20 is written in the NAND flash memory 3, the buffer 7 temporarily stores a specified amount of data (for example, one page of data). When data read from the NAND flash memory 3 is transmitted to the host 20, the buffer also temporarily stores a specified amount of data.

The CPU 8 controls operations of the whole memory card 1. When, for example, the memory card 1 receives a power supply, the CPU 8 loads firmware (a control program) stored in the ROM 9 onto the RAM 10 to execute a predetermined process. The CPU 8 thus creates various tables on the RAM 10, accesses a relevant area on the NAND flash memory 3 in response to a write, read, or erase command from the host 20, or controls a data transfer process through the buffer 7.

The ROM 9 is a memory that stores, for example, control programs used by the CPU 8. The RAM 10 is a memory used as a work area for the CPU 8 to store control programs and various tables.

Figure 3:
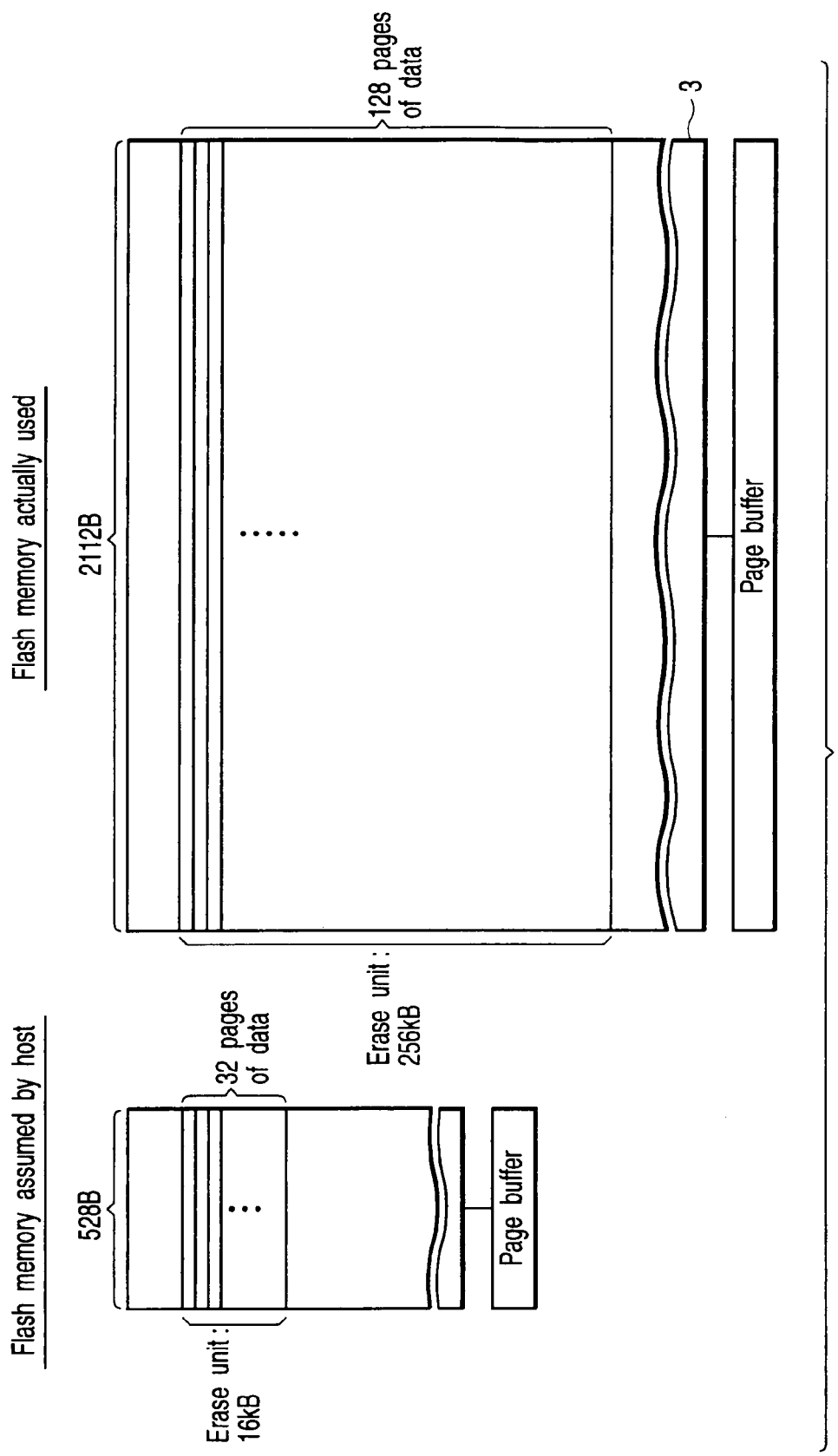
FIG. 3 is a diagram showing a difference in data arrangement between a flash memory assumed by a host system and a flash memory actually used.

FIG. 3 is a diagram showing a difference in data arrangement between a flash memory assumed by the host 20 and the flash memory actually used (that is, the NAND flash memory 3 in the memory card 1).

In the flash memory assumed by the host 20, each page has 528 bytes (512 bytes of data storage section+16 bytes of redundant section), and 32 pages correspond to one erase unit (that is, 16 Kbytes+0.5 Kbytes (in this case, K is 1,024)). A card in which such a flash memory card is mounted will hereinafter sometimes be referred to as a "small block card".

On the other hand, in the flash memory 3 actually used, each page has 2,112 bytes (512 bytes of data storage section x 4+10 bytes of redundant section x 4+24 bytes of management data storage section), and 128 pages correspond to one erase unit (that is, 256 Kbytes+8 Kbytes. A card in which such a flash memory card is mounted may hereinafter be referred to as a "large block card". For convenience, the erase unit for the small block card will hereinafter be referred to as 16 Kbytes. The erase unit for the large block card will hereinafter be referred to as 256K bytes.

Each of the flash memory assumed by the host 20 and flash memory 3 actually used comprises a page buffer required to receive or output data from or to the flash memory. The page buffer provided in the flash memory assumed by the host 20 has a storage capacity of 528 bytes (512 bytes and 16 bytes). On the other hand, the page buffer provided in the flash memory actually used has a storage capacity of 2,112 bytes (2,048 bytes and 64 bytes). For each data write or the like, each page buffer receives or outputs one page of data from or to the flash memory, the page corresponding to its storage capacity.

In the example shown in FIG. 3, the flash memory 3 actually used has an erase block size 16 times as large as that of the flash memory assumed by the host 20. However, the present invention is not limited to this aspect. Another configuration is possible provided that the erase block size of the flash memory 3 actually used is substantially an integral multiple of that of the flash memory assumed by the host 20.

To make the large block card a product that is effective in a practical sense, the flash memory 3, shown in FIG. 3, desirably has a storage capacity of 1 Gbits or more. If the flash memory 3 has a storage memory of, for example, 1 Gbits, there are 512 256-Kbyte blocks (erase unit).

FIG. 3 illustrates that the erase unit is a 256-Kbyte block. However, it is also effective in a practical sense to configure the flash memory so that the erase unit is, for example, 128 Kbytes. In this case, there are 1,024 128-Kbyte blocks.

FIG. 3 also shows that the erase block size of the flash memory 3 actually used is larger than that of the flash memory assumed by the host 20. However, the present invention is not limited to this aspect, the flash memory may be configured so that the flash memory 3 actually used has a smaller erase block size than the flash memory assumed by the host 20.

Figure 4:
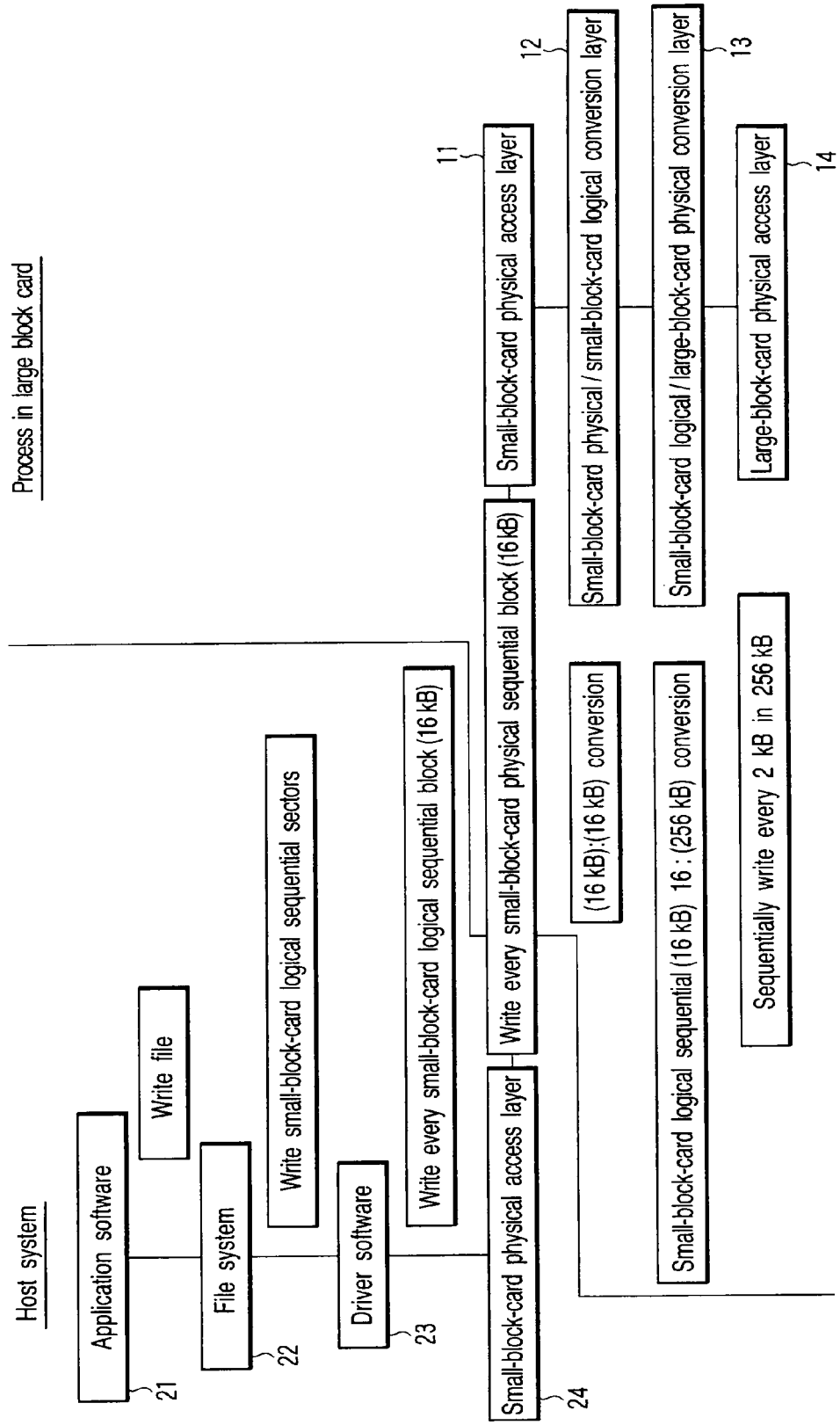
FIG. 4 is a chart showing the communication hierarchy of the host system and of the memory card (large block card)

FIG. 4 is a chart showing the communication hierarchy of the host system and of the memory card (large block card).

The host 20 system has application software 21, a file system 22, driver software 23, and a small-block-card physical access layer 24. On the other hand, the memory card 1 (large block card) has a small-block-card physical access layer 11, a small-block-card physical/small-block-card logical conversion layer 12, a small-block-card logical/large-block-card physical conversion layer 13, and a large-card-block physical access layer 14.

For example, the application software 21 in the host 20 requests the file system 22 to write a file in the memory. Then, the file system 22 instructs the driver software 23 on sequential sector writes on the basis of logical block addresses in the small block card. Upon receiving the instruction, the driver software 23 carries out logical/physical block conversions in order to sequentially write data, that is, one 16-Kbyte block at a time, on the basis of logical block addresses of the small block card. The driver software 23 then issues a random write command based on physical block addresses of the small block card, to the large block card through the small-block-card physical access layer 24. The driver software 23 then executes a data transfer.

For both small and large block cards, a write access is premised on the transmission of a (1) command, a (2) page address (row address), a (3) column address, (4) data, and a (5) program confirmation command in this order in accordance with an appropriate protocol.

Upon receiving a write command with logical block addresses of the small block card from the host 20, the small-block-card physical access layer 11 in the large block card acquires not only the physical block addresses and data but also logical block addresses contained in accompanying data.

The small-block-card physical/small-block-card logical conversion layer 12 has a first table used for a data read or the like to convert physical block addresses (each corresponding to 16-Kbyte block) of the small block card into logical block addresses (each corresponding to 16-Kbyte block) of the small block card. When the small-block-card physical access layer 11 receives a write command to acquire logical block addresses of the small block card, the conversion layer 12 reflects the logical block addresses in the first table. The conversion layer 12 also reflects physical block addresses in the first table.

The small-block-card logical/large-block-card physical conversion layer 13 has a second table used for a data read or the like to convert logical block addresses (each corresponding to sequential 16-Kbyte block x 16) of the small block card into physical block addresses (each corresponding to 256-Kbyte physical block) of the large block card. When the small-block-card physical access layer 11 receives a write command to acquire logical block addresses of the small block card, the conversion layer 12 reflects the logical block addresses in the second table.

On the basis of the logical block addresses acquired by the small-block-card physical access layer 11 upon receiving the write command, the large-block-card physical access layer 14 determines how the data is arranged inside the flash memory 3. The large-block-card physical access layer 14 then sequentially writes 16 Kbytes of data in a 256-Kbyte physical block the memory by writing 2 Kbytes (one page) of data during each operation. The large-block-card physical access layer 14 stores the logical and physical block addresses of the small block card which have been acquired, in a predetermined area within a managed data area inside the flash memory 3.

The host 20 thus issues a command based on physical block addresses of the small block card. Accordingly, the large block card carries out management so as to make it possible to determine which 256-Kbyte physical block contains data corresponding to certain physical block addresses of the small block card. Specifically, the large block card manages the correspondences between logical block addresses and physical block addresses for every 16-Kbyte block. The large block card also carries out management so as to make it possible to determine which 256-Kbyte physical block in the large block card contains data corresponding to a 256-Kbyte block of consecutive logical block addresses of the small block card.

FIGS. 5A and 5B are diagrams showing the format of a command sent by the host 20.

A packet for a command sent by the host 20 contains various pieces of information such as command type information (in this case, "write"), addresses (physical block addresses), and data (actual data such as contents and accompanying data (512 bytes+16 bytes)) as shown in FIG. 5A.

In a packet in this format, "logical block addresses" (logical addresses corresponding to a 16-byte block to be accessed) of the small block card are arranged at a predetermined location in the accompanying data as shown in FIG. 5B. The large block card acquires not only the command type information, physical block addresses, and data but also the "logical block addresses". The "logical block addresses" are not added for a read command.

Figure 6:
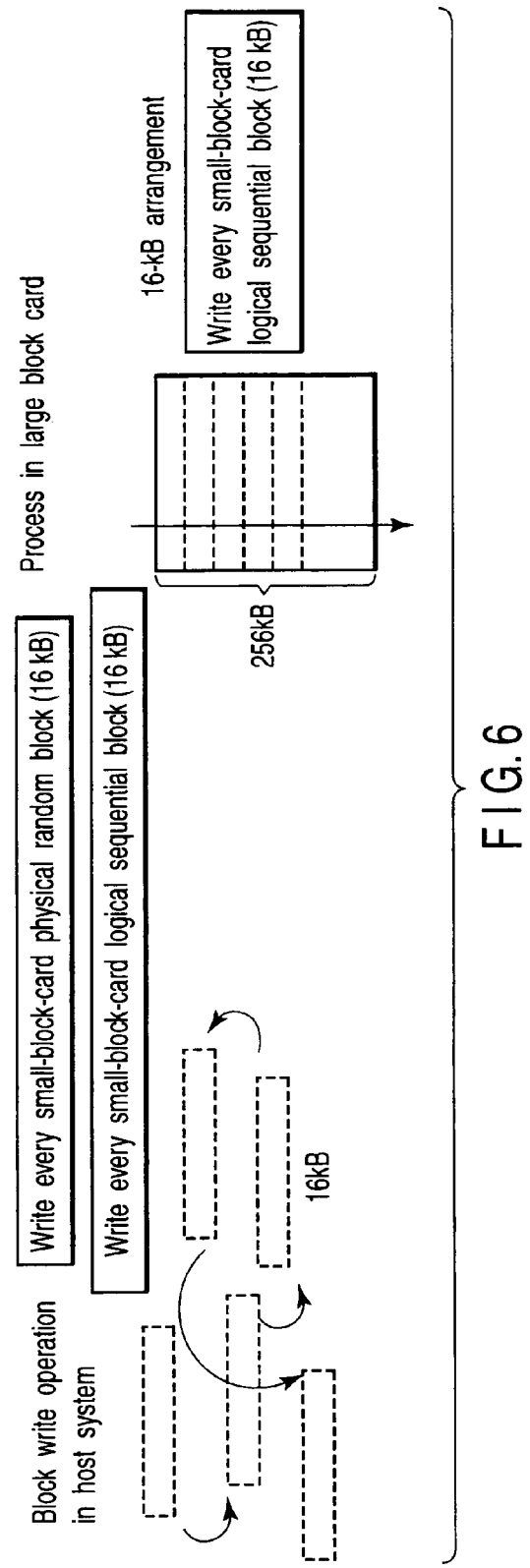
FIG. 6 is a diagram showing a comparison of a block write operation assumed by the host with a write operation actually performed by the memory card (large block card)

FIG. 6 is a diagram showing a comparison of a block write operation assumed by the host with a write operation actually performed by the memory card 1 (large block card).

When a sequential write operation in 16-Kbyte blocks is performed on the basis of logical addresses of the small block card, the host 20 (the left of the figure) performs a random write operation in 16-Kbyte blocks on the basis of physical block addresses of the small block card.

On the other hand, upon receiving a write command from the host 20, the large block card (the right of the figure)

sequentially writes every 16 Kbytes of data in the flash memory 3 on the basis of logical block addresses of the small block card.

As previously described, the host 20 performs a random write operation in 16 Kbytes on the basis of physical addresses for small blocks. Such a random write operation involves many processes of rewriting only a part of a large block (256 Kbytes). The NAND flash memory only allows data to be erased in block units. Accordingly, if a block is partly rewritten, it is necessary to write new data to replace the corresponding part of old data, in a new block from which data has already been erased and then copy the remaining data which is not to be rewritten, from the old block containing the old data to be replaced with the new data, to the new block. In this manner, the process of rewriting only a part of a block involves an operation of copying data that is not to be rewritten. Consequently, many processes of rewriting only a part of a block may result in a significant increase in overhead. Thus, in the present embodiment, the large block card reassigns the physical addresses in accordance with the order of the logical addresses obtained from the host 20. This reduces the occurrence of writes to only a part of a block to suppress an increase in overhead.

FIG. 7 is a diagram showing the block format of the NAND flash memory 3 in the large block card (for a 256-Kbyte physical block corresponding to an erase unit).

In the large block card, a 256-Kbyte physical block corresponding to an erase unit contains 16 blocks in which data corresponding to 16 Kbytes, corresponding to a unit managed by the host 20, is written (these blocks will hereinafter be referred to as host managed blocks). For a data write, individual data are arranged in the order of the logical block addresses of the small block card.

Each host managed block includes eight pages. Each page contains four 512-byte data areas and 10-byte ECC areas each corresponding to one data area. Further, a 24-byte managed data area is provided after the last (fourth) 512-byte data area in a page. Thus, the last 10-byte ECC area in the page corresponds to both fourth 512-byte data area and 24-byte managed data area.

For example, the last of 128 24-byte managed data areas contained in a 256-byte physical block corresponding to the erase unit stores both address information corresponding to physical block addresses acquired from a command sent by the host 20 (this information will hereinafter be referred to as "host managed physical addresses) and address information corresponding to logical block addresses acquired from the command sent by the host 20 (this information will hereinafter be referred to as "host managed logical addresses). The "host managed physical addresses" and "host managed logical block addresses" stored in each 256-Kbyte block are used to create the first table possessed by the small-block-card physical/small-block-card logical conversion layer 12 and the second table possessed by the small-block-card logical/large-block-card physical conversion layer 13 as described in FIG. 4.

Figure 8:
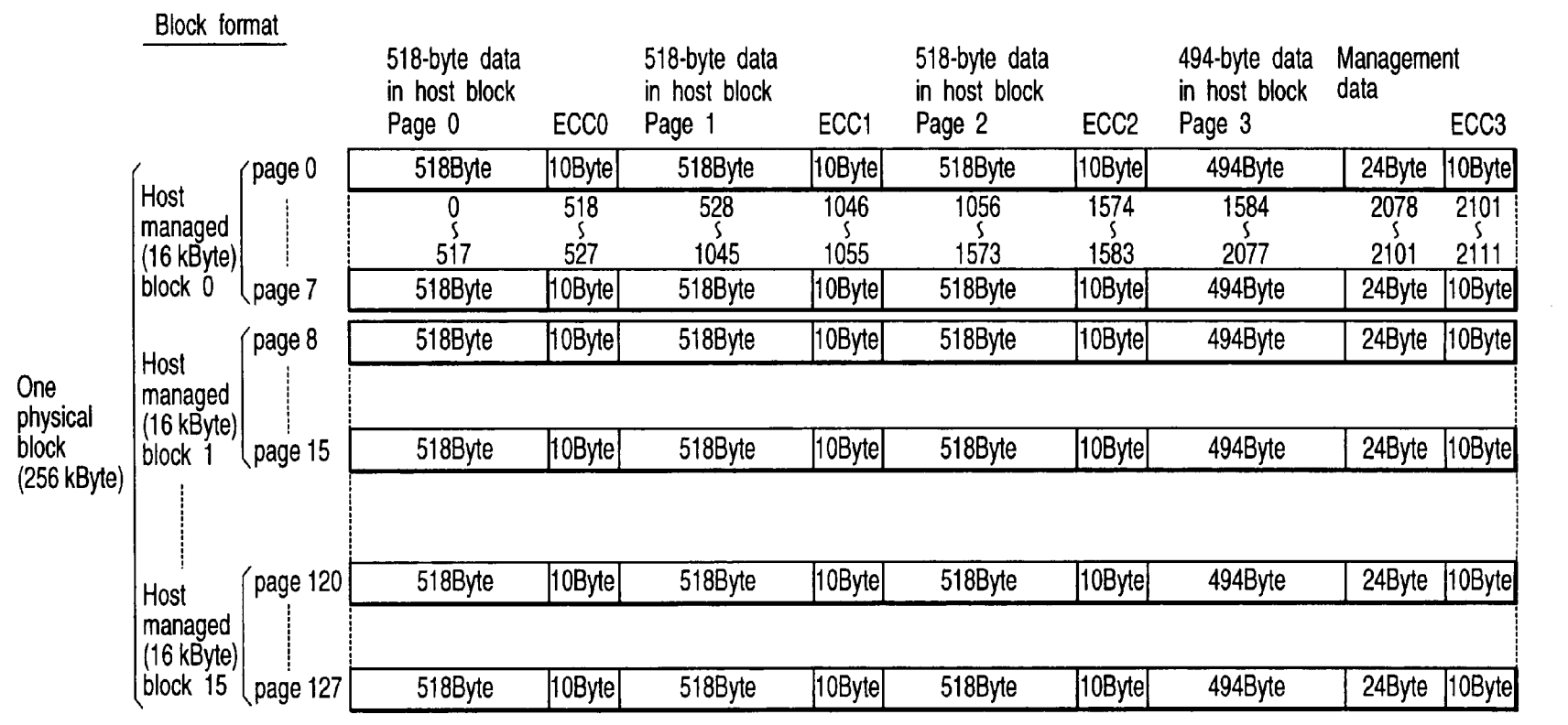

FIG. 8 is a diagram showing an example of a block format different from that shown in FIG. 7.

The block format in FIG. 8 differs from the block format in FIG. 7 in the arrangement of the areas ECC0, ECC1, and ECC2. However, the user data storage capacity of each page is the same for both block formats in FIGS. 7 and 8. That is, in the block format in FIG. 7, each page is provided with the 2048-byte (512 bytes+512 bytes+512 bytes+512 bytes) storage area. On the other hand, in the block format in FIG. 8, each page is provided with a 2048-byte (518 bytes+518 bytes+518 bytes+494 bytes) storage area. The description below is premised on the employment of the block format in FIG. 8.

Figure 9:
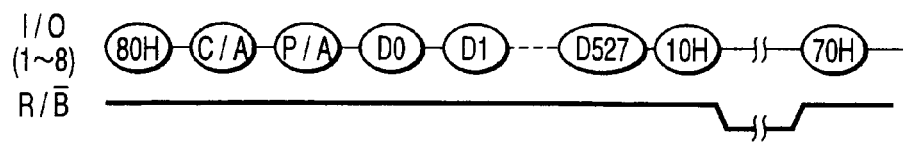
FIG. 9 is a timing chart showing an example of signals to an I/O and R/B pins of the memory card which signals are used when the host executes writes on the memory card according to the present embodiment.

FIG. 9 is a timing chart showing an example of signals to I/O and R/B pins of the memory card which signals are used when the host 20 executes writes on the memory card 1 according to the present embodiment.

The host 20 controls a memory card assuming that the memory card is a nonvolatile memory having a 16-Kbyte erase block size. For example, for a write in the memory card, the host 20 inputs a serial data input command 80H (H denotes a hexadecimal number) to I/O pins 1 to 8. Then, the host 20 inputs a column address C/A and a page address P/A to the I/O pins 1 to 8. The column address C/A and the page address P/A are provided for a virtual physical address space assumed by the host 20 for the memory card 1.

Moreover, the host 20 inputs write data to each of the I/O pins 1 to 8 528 times. Specifically, the host 20 sequentially shifts 528 bits (a total value for all the I/O pins) of data in each of the I/O pins while clocking an input signal to the write enable pin 528 times. Once the data shift-in has been completed, the host 20 inputs a program command 10H to the input pins 1 to 8. In response to this, the memory card outputs a low-level signal to the R/B pin to indicate that the memory card is busy. A predetermined time later, the memory card outputs a high-level signal to the R/B pin to indicate that the memory card is ready.

However, the status of the R/B pin in FIG. 9 only indicates the status of the memory card 1 to the host 20. That is, in FIG. 9, even when the R/B pin indicates a busy status (that is, outputs a low level) in response to the input of the program command 10H, this does not always indicate that an internal write operation (that is, transfer of data from the page buffer to a memory cell array) is actually being performed on the NAND flash memory 3. Even if the R/B pin returns to the ready status, this does not always indicate that an internal write operation on the NAND flash memory 3 has actually been completed.

Figure 10:
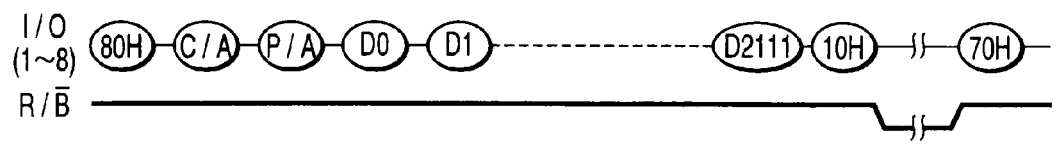
FIG. 10 is a timing chart showing an example of signals for the I/O and R/B pins of a nonvolatile memory in the memory card which signals are used when a controller in the memory card executes writes on the nonvolatile memory in the memory card according to the present embodiment.

FIG. 10 is a timing chart showing an example of signals to the I/O and R/B pins of the NAND flash memory 3 which signals are used when the controller 4 in the memory card 1 executes writes on the NAND flash memory 3 in the memory card 1 according to the present embodiment.

The controller 4 recognizes that the NAND flash memory 3 is nonvolatile and has a 256-Kbyte erase block size. For example, for a write in the NAND flash memory 3, the controller 4 inputs the serial data input command 80H (H denotes a hexadecimal number) to I/O pins 1 to 8. Then, the controller 4 inputs the column address C/A and the page address P/A to the I/O pins 1 to 8. The column address C/A and the page address P/A are provided for a real physical address space assumed by the controller 4 for the NAND flash memory 3. Accordingly, these addresses do not necessarily match the column address C/A and page address P/A in FIG. 9.

Moreover, the controller 4 inputs write data to each of the I/O pins 1 to 8 2,112 times. Specifically, the controller 4 sequentially shifts 2,112 bits (a total value for all the I/O pins) of data in each of the I/O pins while clocking an input signal to the write enable pin 2,112 times. Once the data shift-in has been completed, the controller 4 inputs the program command 10H to the input pins 1 to 8. In response to this, the memory card outputs a low-level signal to the R/B pin to indicate that the memory card is busy. A predetermined time later, the memory card outputs a high-level signal to the R/B pin to indicate that the memory card is ready. The status of the R/B pin in FIG. 10 indicates the actual status of the NAND flash memory 3 to the controller 4.

In FIGS. 9 and 10, previously described, each of the inputs of the column address C/A and page address P/A is shown completed in one cycle. However, the input may require two or more cycles depending on the capacity of the memory card 1 or NAND flash memory 3.

As can be seen in FIGS. 9 and 10, previously described, the time for which the memory card may be busy is restricted. That is, during this time, the controller must write the data and the predetermined time later, it must indicate to the host that the memory card has gotten ready.

In the description below, the physical block addresses and logical block addresses in the flash memory assumed by the host 20 will simply be referred to as "xPBA" and "xLBA", respectively. The physical block addresses in the flash memory 3 will hereinafter simply be referred to as "PBA".

In the present embodiment, the data storage area of the flash memory assumed by the host 20 is divided into a plurality of zones, which are numbered for management. Specifically, a group of 1024 blocks corresponding to physical block addresses xPBA1 to 1023 is defined as Zone0, a group of 1024 blocks corresponding to physical block addresses xPBA1024 to 2047 is defined as Zone1, a group of 1024 blocks corresponding to physical block addresses xPBA2048 to 3071 is defined as Zone2, . . . . Each zone is the associated with 1,000 xLBAs. The physical block address xPBA0 is associated with a block storing a card information structure (CIS) (described later) for the memory card 1.

Figure 11:
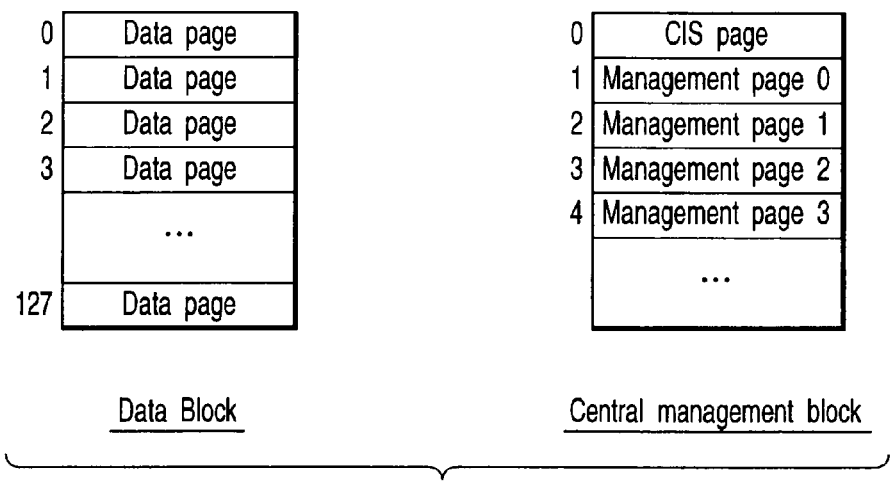
FIG. 11 is a diagram showing the general organization of a data block and a central management block on a flash memory.

FIG. 11 is a diagram showing the general organization of a data block and a central management block on the flash memory 3.

The data block (one physical block) is made up of 128 data pages also shown in FIG. 8, previously described. A plurality of such data blocks are present on the flash memory 3 and are used to store user data (data such as documents, still images, and moving pictures which can be read or written by the user). In a predetermined area in, for example, a final data page of each data block, information on the addresses xPBA and xLBA is stored which corresponds to the address PBA of the data block. This information is used when the address conversion tables are to be created.

On the other hand, the central management block (one physical block) is made up of one CIS (Card Information Structure) page and a plurality of management pages 0, 1, 2, 3, . . . . Only one central management block is present on the flash memory 3. The central management block is a special block that stores various pieces of management information (basically information that cannot be freely read or written by the user and that is used by the host or controller, for example, upon activating the flash memory 3) on the flash memory 3 in a lump. The central management block is provided in one of all physical areas which has the highest robustness. That is, the central management block is provided in one of all physical areas which has the smallest number of ECC errors.

The CIS page of the central management block is used to determine whether or not the flash memory 3 is formatted in accordance with the physical format specification of a predetermined memory card. The management pages 0, 1, 2, 3, . . . store the numbers (Zone Nos.) of the zones to which the individual data blocks belong and the status of errors in each data block. Each management page is used to, in particular, determine the addresses PBA of the data blocks corresponding to a zone pre-specified as a table creation target zone, when the address conversion tables are to be created.

Figure 12:
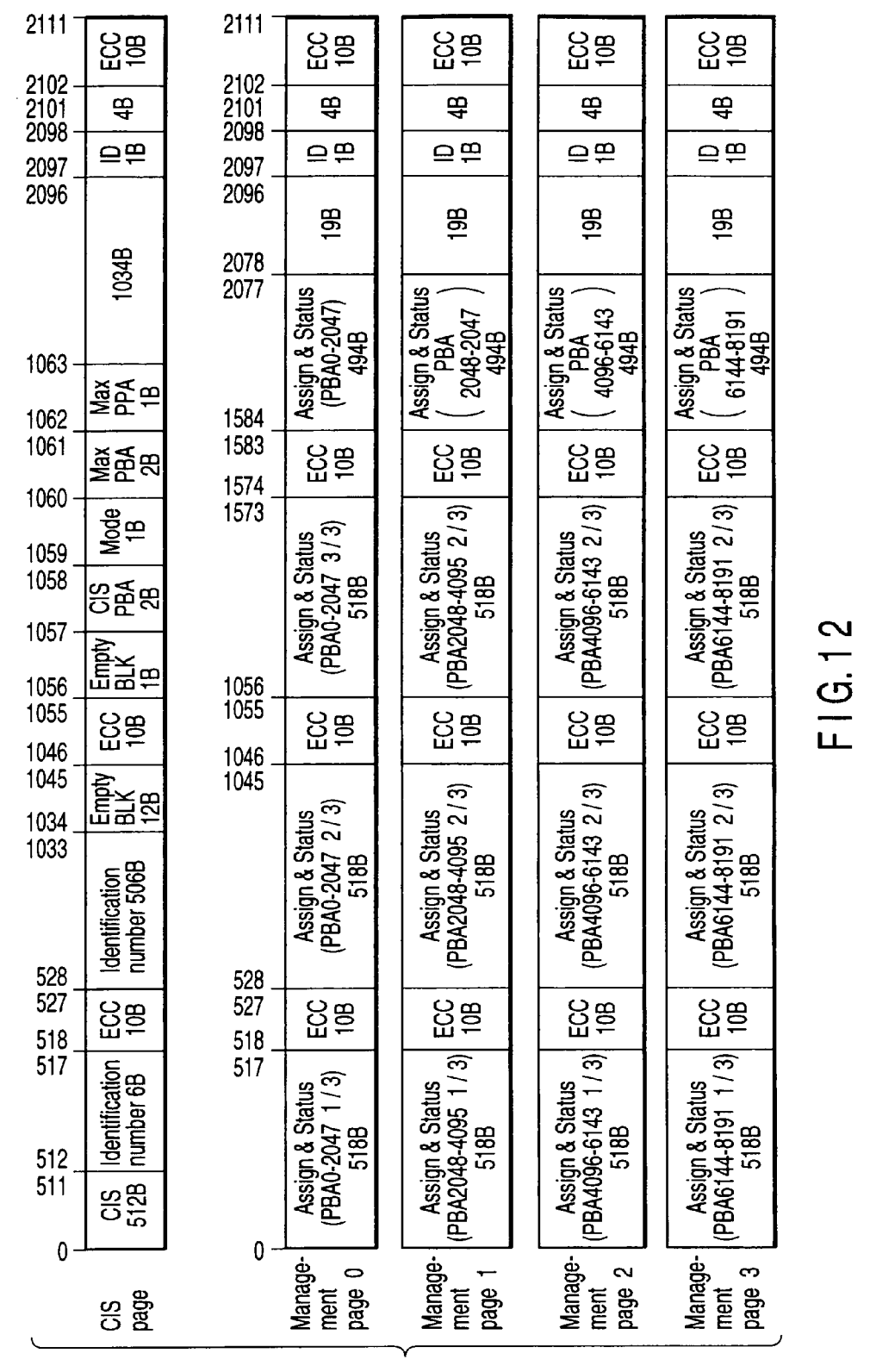
Figure 14:
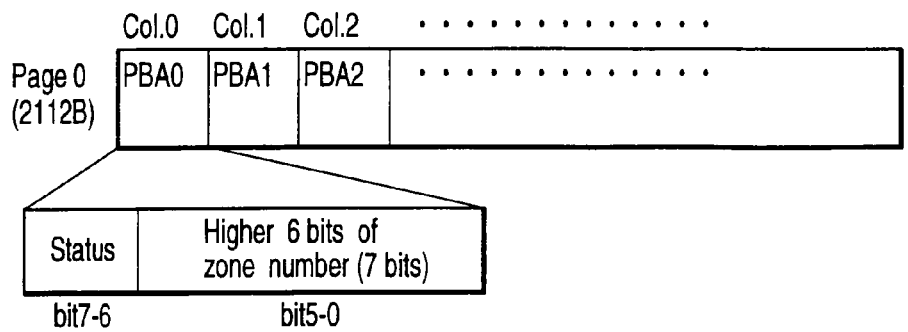
FIG. 14 is a diagram showing an example of the format of columns in a management page 0 shown in FIG. 12.

FIG. 12 is a diagram showing an example of the format of the central management block shown in FIG. 11. FIG. 13 is a table illustrating essential parts of the information shown in FIG. 12. FIG. 14 is a diagram showing an example of the format of each column in the management page 0, shown in FIG. 12. Now, with reference to FIGS. 12 to 14, a detailed description will be given of the CIS page and management pages 0, 1, 2, 3, . . . .

The CIS page in FIG. 12 has various areas represented by "CIS", "CIS-PBA", "identification number", "ID", "empty BLK", "ECC", "Mode", "Max PBA", "Max PPA", "1034B", "4B", and the like. The area "CIS" stores card information structure data (CIS data) to be read by the host 20. The area "CIS-PBA" stores a physical address (xPBA) indicating the position at which the CIS data is stored (the physical address is stored so as to deal with a rewrite of the CIS data possibly executed by the host 20). The area "identification number" stores the identification number of the memory card 1. The area "ID" stores the type of data written in the page and a bad block attribute. The area "empty BLK" stores the address of an empty block from which data has been erased. The area "ECC" stores an ECC corresponding to information on a column address 0-517, an ECC corresponding to information on a column address 528-1045, and an ECC corresponding to information on a column address 1056-2101. The areas "Mode", "Max PBA", "Max PPA", "1034B", and "4B" store various pieces of information used during debugging (a detailed description of theses areas is omitted).

Each of the management pages 0, 1, 2, 3, . . . has a plurality of areas represented by "Assign & Status", "ID", "ECC", "19B, and "4B". The area "Assign & Status" stores, for each data block, the number of a zone assigned to the data block and a status indicating how many ECC errors are present in the data block. The area "ID" stores the type of data written in the page and the bad block attribute. The area "ECC" stores the ECC corresponding to information on the column address 0-517, the ECC corresponding to information on the column address 528-1045, an ECC corresponding to information on a column address 1056-1573, and an ECC corresponding to information on a column address 1584-2101. The areas "19B" and "4B" are empty (unused).

Of all the management pages 0, 1, 2, and 3, for example, the management page 0 will be focused on. As shown in FIG. 14, individual columns Col.0, Col.1, Col.2, . . . constituting the management page 0 are provided with areas corresponding to addresses PBA0, PBA1, PBA2, . . . identifying the individual data blocks. Each area (1 byte) stores the combination of the above described zone number (6 of 7 bits) and status (2 bits).

Figure 15:
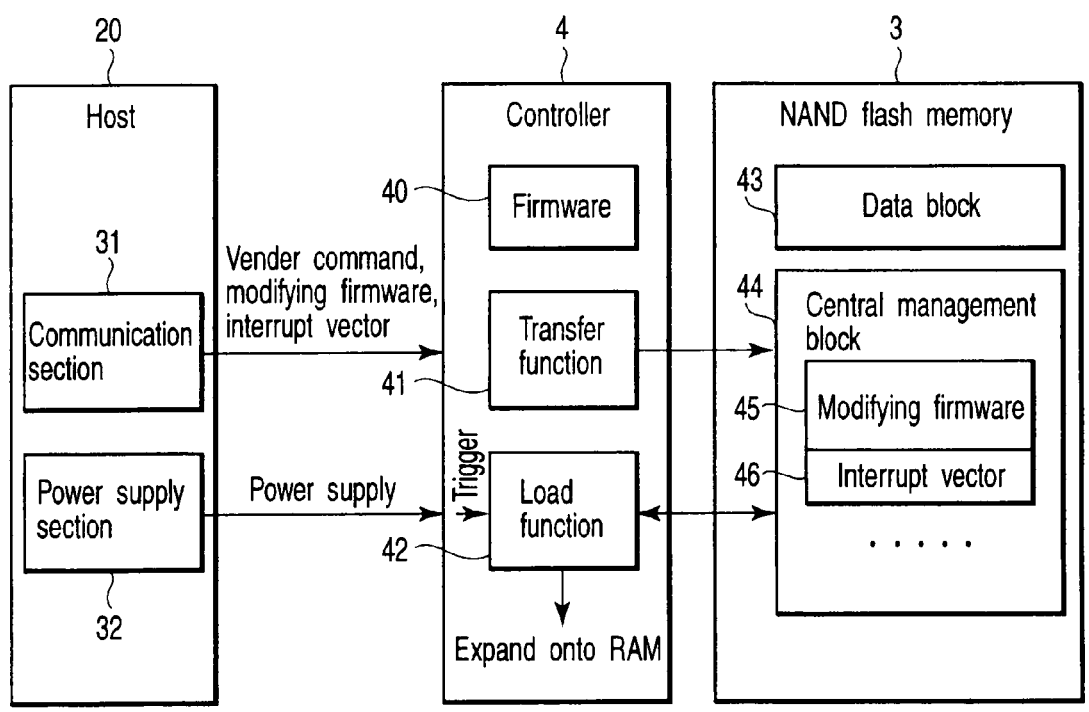
FIG. 15 is a diagram showing the configuration of functions for efficiently modifying firmware stored in a ROM shown in FIG. 2.

FIG. 15 is a diagram showing the configuration of functions for efficiently modifying firmware stored in the ROM 9, shown in FIG. 2. The description below also refers to the hardware configuration shown in FIG. 2.

The controller 4 shown in FIG. 15 has firmware 40, a transfer function 41, and a load function 42 which are executed by the above CPU 8.

The firmware 40, provided in the controller 4, corresponds to the firmware already described with reference to FIG. 2 and stored in the ROM 9. The firmware 40 is loaded on the RAM 10 and executed by the CPU 9. The firmware 40 includes a control program for a protocol conversion (including an address converting process using the above address conversion table). Further, the firmware 40 is made up of a plurality of functions (for example, a plurality of modules).

The flash memory 3 has a data block 43 and a central management block 44 (corresponding to the data block and central management block, respectively, already described with reference to FIGS. 1 to 14). The central management block 44 has an area in which modifying firmware 45 for modifying functions of the firmware 40 and an interrupt vector 46 having information (for example, the address of the modifying firmware on the RAM area) required in activation of the modifying firmware are stored. Plural combinations of such modifying firmware and an interrupt vector can be accumulated in this area.

When the vender of the firmware 40 (or controller 4 or memory card 1) attempts to make modification such as upgrade to a function of the firmware 40 (to change the function or add a function), the vender creates modifying firmware and interrupt vectors and distributes them to valid parties (to the vender itself, valid manufacturers, or the like before shipment and to valid users after shipment). Further, interrupt vectors may also be created which are required to activate one or more functions (modules) of the firmware 40 not to be modified (that is, to be excluded from modification targets).

The modifying firmware or interrupt vector may have the following additional information: information required to identify the modifying firmware or interrupt vector, information required to identify one or more functions (modules) to be modified, information required to identify one or more functions (modules) not to be modified, and information indicating a version number, the type of the modification, that is, a change or addition, and the like.

A person, who receives the modifying firmware and interrupt vectors distributed, performs a predetermined operation on the memory card 1 connected to the host 20. The person can thus modify the functions of the firmware 40. In this case, the host 20 sends a vender command containing the modifying firmware and the corresponding interrupt vectors to the memory card 1 through a communication section 31.

The transfer function 41, provided in the controller 4, can detect the vender command sent by the host 20. If the vender command is detected, the transfer function 41 acquires the modifying firmware and interrupt vectors contained in the vender command. The transfer function 41 then writes the modifying firmware and interrupt vectors in a predetermined area (for example, the above empty areas) of the central management block 44 of the flash memory 3.

The transfer function 41 may also include a function of identifying, on the basis of the information contained in the vector command, the interrupt vectors or modifying firmware, the functions (modules) to be modified, the version number, the type of the modification, that is, a change or addition, and the like. In this case, on the basis of the version number and the like, the transfer function 41 can determine whether the modifying firmware just acquired is a revised version of modifying firmware previously acquired or is new. If the modifying firmware acquired is a revised version, the transfer function 41 overwrites the corresponding modifying firmware in the central management block 44 with the revised version (also overwrites the interrupt vectors). On the other hand, if the modifying firmware acquired is new, the transfer function 41 writes the new modifying firmware in an unused area in the central management block 44 (also writes the interrupt vectors). Further, an interrupt vector required to activate the functions (modules) of the firmware 40 not to be modified may also be stored in the central management block 44.

Once the processing for the vender command has been completed, the memory card 1 may be reactivated and the load function 42 (described later) may be used to expand various modifying firmware and interrupt vectors written to the flash memory 3, onto the RAM 10.

The load function 42, provided in the controller 4, is activated in response to a trigger signal corresponding to an event that detects a power supply from a power supply section 32 in the host 20 or an event indicating that the processing for the vender command has been completed. The load function 42 activated expands the firmware 40 stored in the ROM 9 and the modifying firmware 45 and interrupt vector 46 stored in the central management block 44 of the flash memory 3, onto the RAM 10. The load function 42 also issues an interrupt signal to, for example, the CPU 8. In this case, upon receiving the interrupt signal, the CPU 8 executes the relevant functions of the firmware 40 and the modifying firmware 45 in accordance with information (for example, addresses on the RAM area) indicated by the interrupt vectors present on the RAM 10. This allows the desired function modification to be made to the firmware 40.

Figure 16:
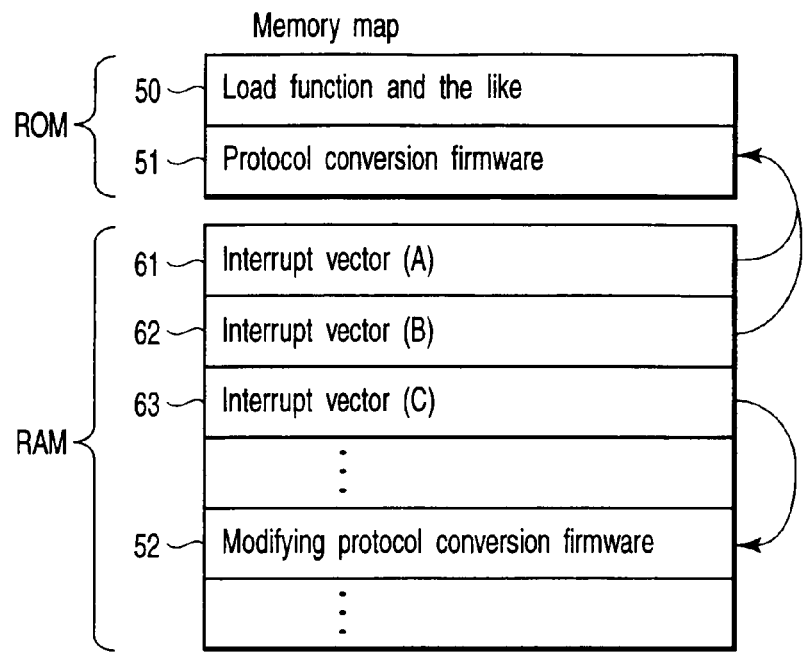
FIG. 16 is a diagram showing an example of a memory map used by a CPU.

FIG. 16 is a diagram showing an example of a memory map used by the CPU 8.

The ROM 9 stores a load function and the like 50 and protocol conversion firmware 51. The load function and the like 50 correspond to the load function 42 and transfer function 41, shown in FIG. 15. The protocol conversion firmware 51 corresponds to the firmware 40, shown in FIG. 15.

Modifying protocol convention firmware 52 is loaded in the RAM 10. The modifying protocol conversion firmware 52 corresponds to the modifying firmware 45, shown in FIG. 15.

Further, an interrupt vector (A) 61, an interrupt vector (B) 62, and an interrupt vector (C) 63 are loaded in the RAM 10. For example, the interrupt vector (A) 61 and the interrupt vector (B) 62 are information required to activate a first and second functions (modules) of the protocol conversion firmware 51. The interrupt vector (A) 61 and the interrupt vector (B) 62 have addresses indicative of the positions of the modules. On the other hand, the interrupt vector (C) 63 is information required by the CPU 8 to activate the protocol conversion firmware 51. The interrupt vector (C) 63 has addresses indicative of the positions of relevant modules.

If, for example, the modifying protocol conversion firmware 52 is upgraded, it is updated and the corresponding interrupt vector (C) 63 is updated. Further, if new modifying protocol conversion firmware different from the modifying protocol conversion firmware 52 is added, the corresponding new interrupt vector (for example, the "interrupt vector (D)") is also added.

In the present embodiment, functions of firmware are modified in the configuration using the CPU 8 that carries out a protocol conversion. However, it is also possible to modify functions of firmware in a configuration using a digital signal processor (DSP) that executes a CODEC process, instead of the CPU 8. In this case, the configuration of the various functions is similar to that shown in FIG. 15.

Figure 17:
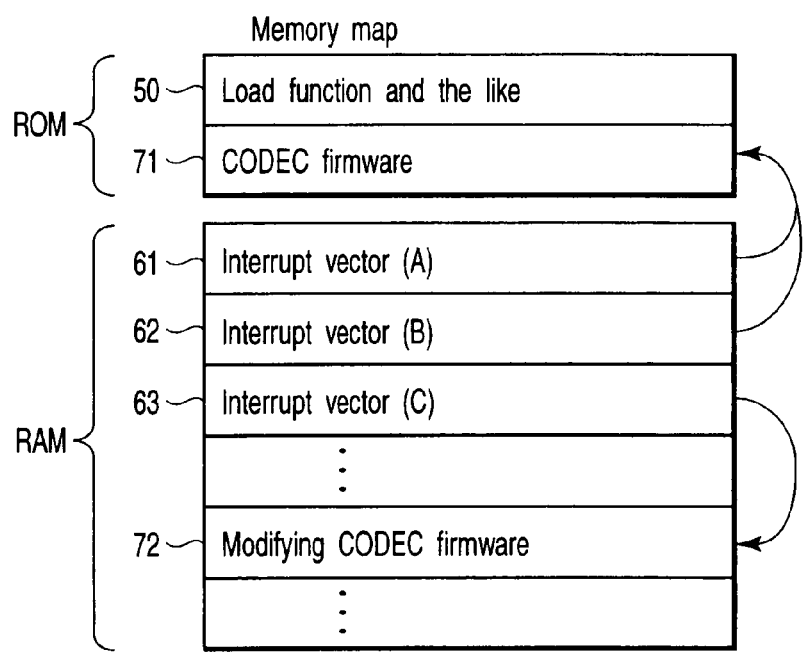
FIG. 17 is a diagram showing an example of a memory map used by a DSP.

FIG. 17 is a diagram showing an example of a memory map used by the DSP. Elements common to those shown in FIG. 16 are denoted by the same reference numerals.

With the DSP, CODEC firmware 71 for a CODEC process is employed instead of the protocol conversion firmware 51 as shown in the memory map in FIG. 17. Further, modifying CODEC firmware 72 for modifying functions of the CODEC firmware 71 is employed instead of the modifying protocol conversion firmware 52.

Figure 18:
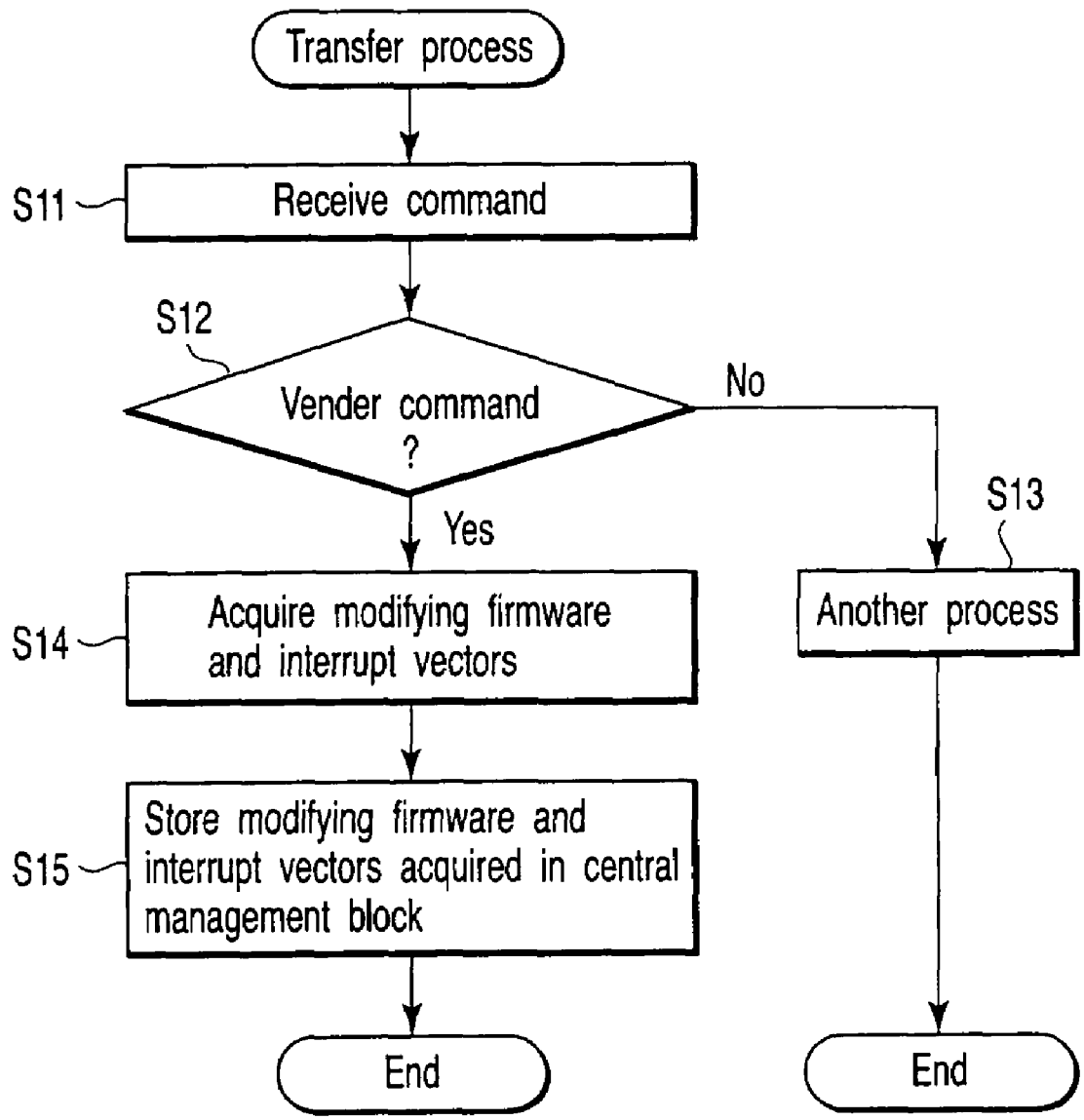
FIG. 18 is a flowchart showing operations relating to a process of transferring modifying firmware and interrupt vectors.

Now, with reference to FIG. 18, description will be given of operations relating to a process of transferring modifying firmware and interrupt vectors. Here, other drawings such as FIG. 15 will also referenced.

The transfer function 41, provided in the controller 4, receives a command sent by the host 20 (step S11). The transfer function 41 then determines whether the command is a vender command (step S12). If the command is not a vender command (No in step S12), the transfer function 41 executes another relevant process (step S13). The transfer function 41 then finishes the process.

On the other hand, if the command is a vender command (Yes in step S12), the transfer function 41 acquires modifying firmware and interrupt vectors contained in the vender command (step S14). The transfer function 41 writes the modifying firmware and interrupt vectors in a predetermined area in the central management block 44 of the flash memory 3 (step S15). The transfer function 41 then ends the process.

Now, with reference to FIG. 19, description will be given of operations relating to a process of loading modifying firmware and interrupt vectors. Here, other drawings such as FIG. 15 will also referenced.

The load function 42, provided in the controller 4, responds to a trigger signal corresponding to an event indicating a power supply from the power supply section 32 in the host 20 or an event indicating that the processing for the vender command has been completed (step S21). If the signal detected is different from the trigger signal (No in step S22), the load function 42 executes another relevant process (step S23). The load function 42 then finishes the process.

On the other hand, if the signal detected is the trigger signal (Yes in step S22), the load function 42 expands the firmware 40 stored in the ROM 9 and the modifying firmware 45 and interrupt vector 46 stored in the central management block 44 of the flash memory 3, onto the RAM 10 (step S24). The load function 42 uses an interrupt signal to notify the CPU 8 of the expansion (step S25). Upon receiving the interrupt signal, the CPU 8 execute the functions of the firmware 40 and the modifying firmware 45 in accordance with the information (for example, addresses on the RAM area) indicated by the interrupt vectors present on the RAM 10. As a result, desired modifications are made to relevant functions of the firmware 40.

Figure 19:
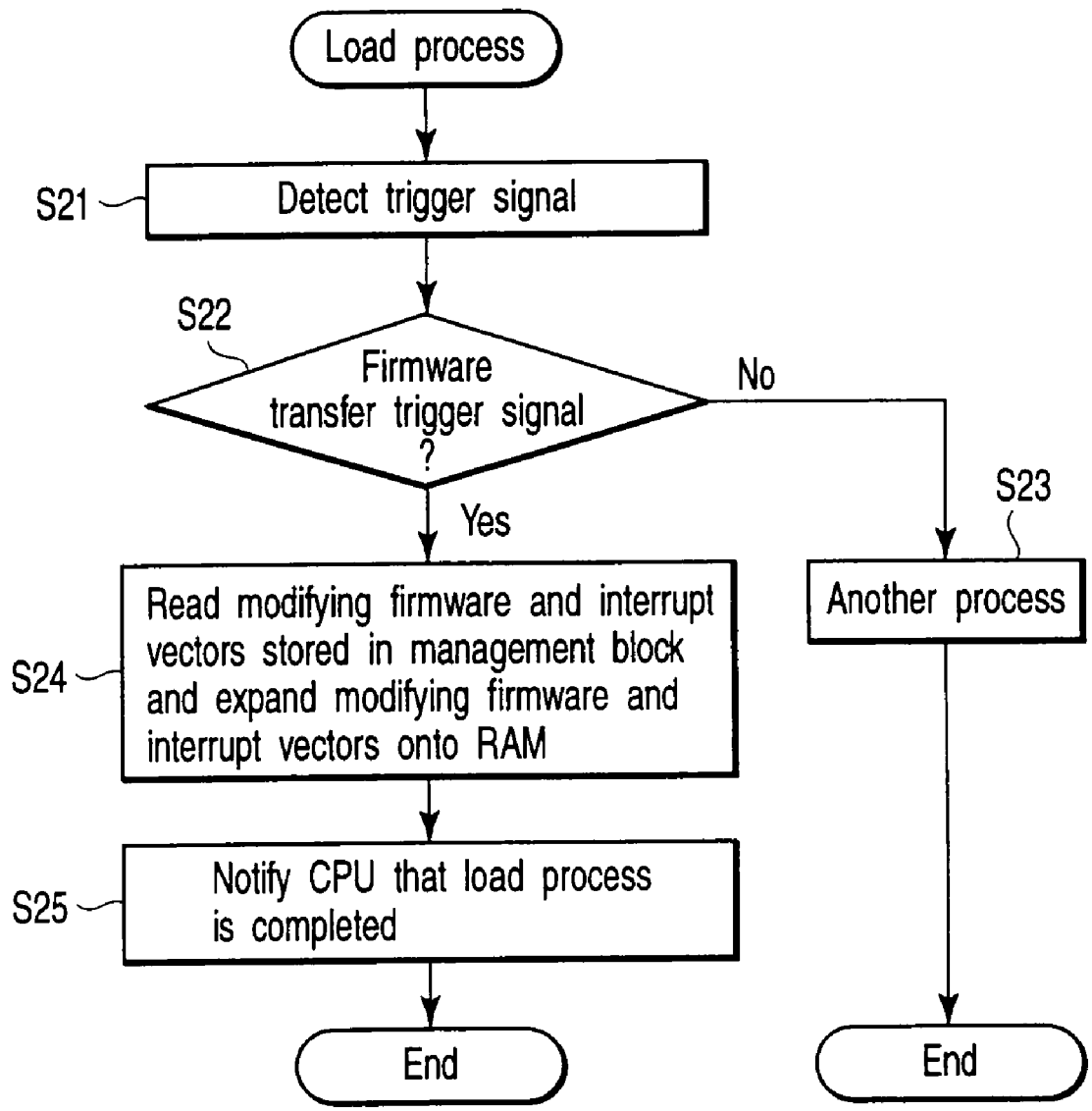
FIG. 19 is a flowchart showing operations relating to a process of loading the modifying firmware and interrupt vectors.

As described above, if a firmware trigger occurs, the controller 4 should expand the modifying firmware 45 and the like stored in the central management block 44, onto the RAM 10 (see step S24 and the like in FIG. 19). At this time, if each block is retrieved for all memory spaces in the flash memory 3 in order to detect the central management block 44, a long time may be required to expand the modifying firmware 45 and the like. Then, temporal restrictions defined in the specifications for the memory card may not be met. Description will be given below of a technique for solving this problem.

Figure 20:
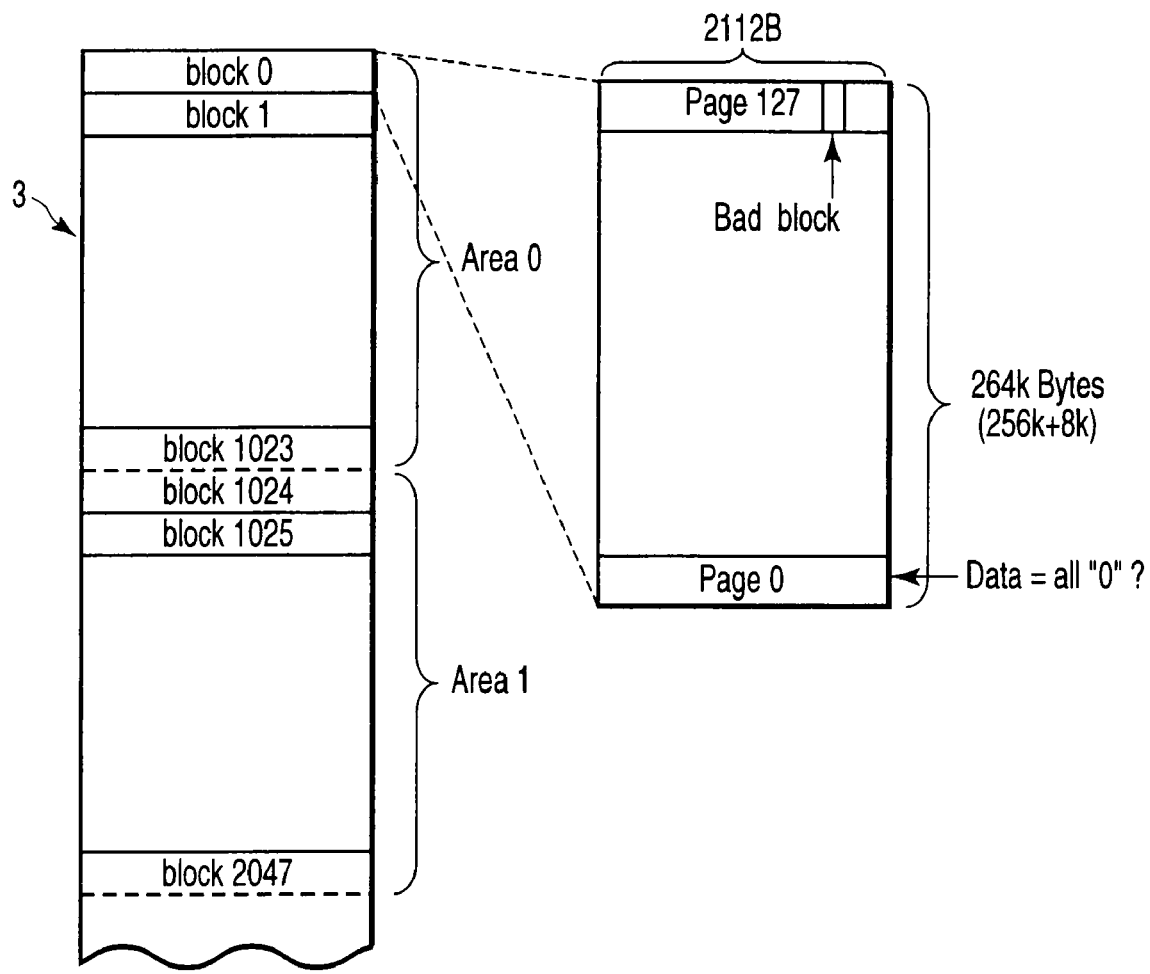
FIG. 20 is a diagram showing an example of the format that enables a central management block to be retrieved in a short time.

FIG. 20 is a diagram showing an example of a format that enables the central management block to be retrieved in a short time.

The storage area of the flash memory 3 is divided into a plurality of areas: Area 0, Area 1, Area2, . . . (preformatted). In the illustrated example, Area0 includes 1,024 blocks (block0 to block1023), Area1 includes 1,024 blocks (block1024 to block2047, . . . .

Each area includes a data block containing a particular page (e.g., page0) that stores information indicating whether or not the previously described central management block is present in the area (such a data block will hereinafter be referred to as a "marking block"). That is, one marking block is provided in each area. In the illustrated example, the marking block in Area0 is block0.

For example, the definitions below are provided. If all the columns constituting the particular page0 have a value of 0, the central management block is not present in the area to which the particular page0 belongs. If at least one column has a value of 1, the central management block is present in the area to which the particular page0 belongs.

Further, a predetermined column (for example, col.2097) on page127 in each block is provided with a bit indicating whether or not the block is a bad block (which is not used for data storage).

If the uppermost block in the area is not a bad block, the particular page is provided in the uppermost block. On the other hand, if the uppermost block is a bad block, the particular page is provided in a normal block (not a bad block) succeeding the bad block.

To retrieve the central management block, the controller 4 (see FIGS. 1 and 2) searches for the marking block contained in each area and references the particular page contained in the marking block. Consequently, the central management block can be retrieved in a short time.

Specifically, the controller 4 sequentially searches for the central management block from the uppermost area to the lowermost area. The controller 4 references page127 in the uppermost block in the search target area to determine whether or not the block is a bad block. If the block is not a bad block, the controller 4 considers the uppermost block to be the marking block. The controller 4 then references page0 in the marking block, which is the particular page. On the other hand, if the uppermost block in the search target area is a bad block, the controller 4 determines whether or not the block succeeding the bad block is a bad block by referencing page127 in the block succeeding the bad block. In this manner, the controller 4 sequentially determines whether or not each block in the search target area, from the uppermost block to the lowermost block, to search for a normal uppermost block that is not a bad block. If the controller 4 successfully searches for the uppermost block but is not a bad block, it considers that block to be the marking block. The controller 4 then references page0 in the marking block, which is the particular page. If the referenced particular page indicates the presence of the central management block, the controller 4 searches all the blocks in the area to which the particular page belongs. The controller 4 thus finds and reads the central management block.

Such a retrieval process executed by the controller 4 is controlled through the CPU 8, which executes a control program loaded onto the RAM 10 from the ROM, or the interface section 5.

Figure 21:
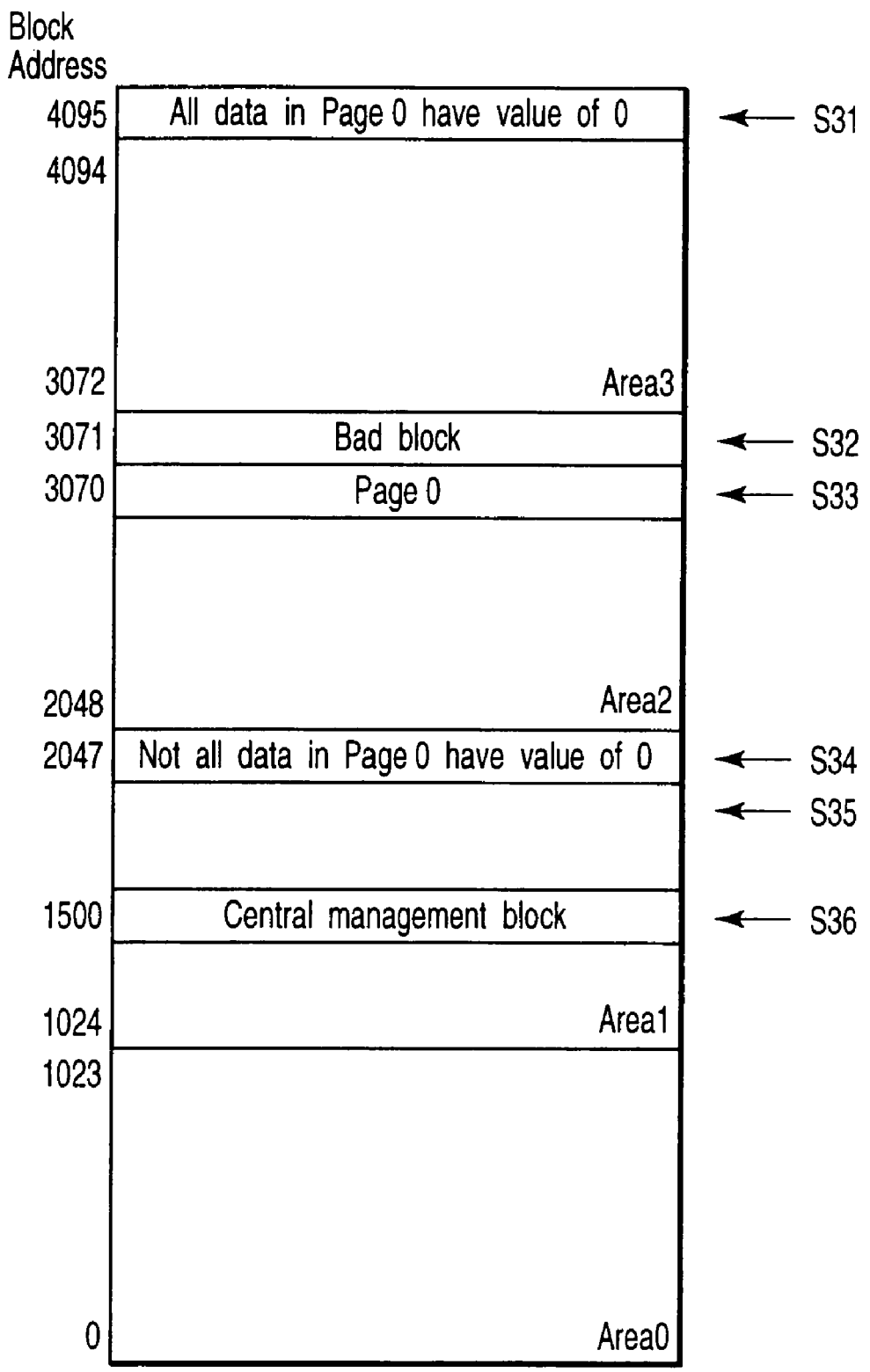
FIG. 21 is a diagram illustrating a specific example of a process in which a controller detects the central management block provided in a certain area.

Now, with reference to FIG. 21, description will be given of a specific example of a process in which the controller 4 detects the central management block provided in a certain area. Assume that the central management block is present in block1500, only block3071 is the bad block.

The controller 4 determines whether or not block4095, the uppermost block of Area3, is a bad block. Since block4095 is not a bad block, the controller 4 determines whether or not all the column data in page0 have a value of 0 (step S31). Since all the column data in page0 have a value of 0, the controller 4 considers that the central management block is not present in Area3. The controller 4 then starts to search the succeeding area.

Then, the controller 4 determines whether or not the uppermost block in Area2, block3071, is a bad block (step S32). Since block3071 is a bad block, the controller 4 determines whether or not the succeeding block (i.e., block3070) is a bad block. Since the succeeding block (i.e., block3070) is not a bad block, the controller 4 determines whether or not all the column data in page0 have a value of 0 (step S33). Since all the column data in page0 have a value of 0, the controller 4 determines that the management block is not present in Area2. The controller 4 then starts to search the succeeding area.

Then, the controller 4 determines whether or not the uppermost block in Area1, block2047, is a bad block. Since block2047 is not a bad block, the controller 4 determines whether or not all the column data in page0 have a value of 0 (step S34). Since not all the column data in page0 have a value of 0 but at least one column has a value of 1, the controller 4 considers that the management block is present in Area1. The controller 4 then sequentially searches for the central management block starting with the uppermost block in Area1 (step S35). The controller 4 detects and reads the central management block in block1500 (step S36).

Figure 22:
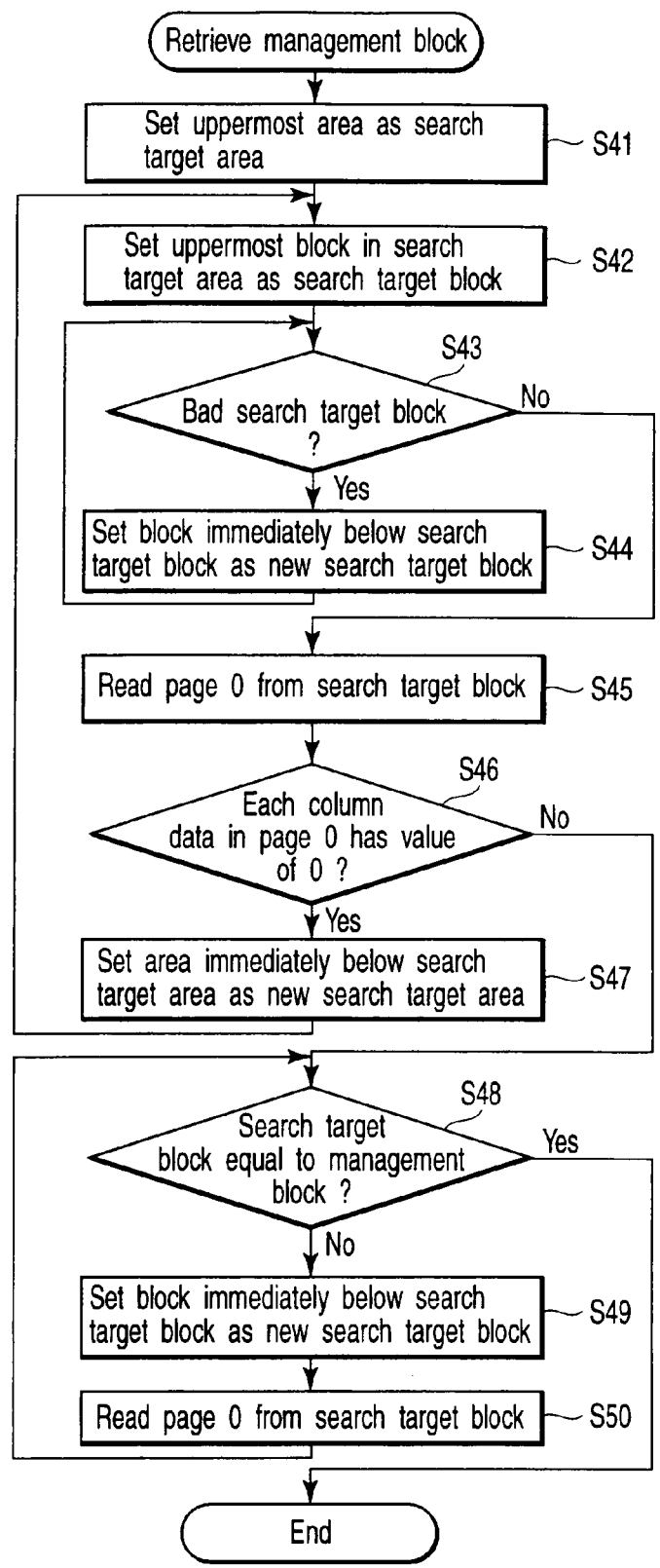
FIG. 22 is a flow chart showing an operation performed by the controller to retrieve the central management block.

Now, with reference to FIG. 22, description will be given of an operation performed by the controller 4 to retrieve the central management block.

For example, when the memory card 1 is powered on, the controller 4 indicates that the memory card is busy. The controller 4 then starts the retrieval process described below.

First, the controller 4 sets the uppermost area as a search target area (step S41) and further sets the uppermost block in the search target area as a search target block (step S42).

The controller 4 determines whether or not the search target block is a bad block (step S43). If the search target block is a bad block (Yes in the step S43), the controller 4 sets the block immediately below the bad block as a search target block (step S44). The controller 4 then repeats the processing in the step S43. On the other hand, if the search target block is not a bad block (No in the step S43), the controller 4 reads page0 from the search target block (step S45).

The controller 4 determines whether or not each column data in the read page0 has a value of 0 (step S46). If all the column data have a value of 0 (Yes in the step S46), the controller 4 considers that the central management block is not present in the search target area. The controller 4 then sets the area immediately below the search target area as a new search target (step S47). The controller 4 then repeats the processing starting with the step S42. On the other hand, if column data having a value of 1 exists (No in the step S46), the controller 4 considers that the central management block is present in the search target area. The controller 4 then sequentially searches for the central management block starting with the uppermost block in the area.

The controller 4 determines whether or not the search target block is the central management block (step S48). If the search target block is not the central management block (No in the step S48), the controller 4 sets the block immediately below the search target block as a new search target (step S49). The controller 4 then reads page0 from the search target block (step S50) and repeats the processing starting with the step S48. On the other hand, if the search target block is the central management block (Yes in the step S48), the controller 4 reads the central management block.

As described above, according to the present embodiment, even if it becomes necessary to modify functions of the firmware before or after shipment of the product, the ROM in the controller need not be replaced with a new one, and desired modifications of the programs can be efficiently performed.

Furthermore, in the above description of the embodiment, management information related to the memory card is managed in a lump by a single central management block, without distribution of the management information. Consequently, all the management information (including the modifying firmware and interrupt vectors) can be placed in one of all the physical areas which is the most robust. This prevents important information from being inadvertently destroyed.

Furthermore, in the above description of the embodiment, the storage area on the flash memory 3 is divided into a plurality of areas. Further, each area is provided with the data block (the marking block) containing the particular page that stores the information indicating whether or not the central management block is present in the area. It is thus possible to immediately determine whether or not the central management block is present in each area. This reduces the time required to retrieve the central management block.

Furthermore, in the above description of the embodiment, the controller 4 carries out management and control (for example, the processes of transferring and loading modifying firmware and interrupt vectors and the process of retrieving the central management block) of the associations between the addresses in the semiconductor memory assumed by the host 20 and the addresses in the semiconductor memory actually used. However, the control may be executed by, for example, the driver software 23 in the host 20.

Furthermore, in the above description of the embodiment, the erase block size of the flash memory 3 actually used is larger than that of the flash memory assumed by the host 20. However, of course, the erase block size of the flash memory 3 actually used may be the same as that of the flash memory assumed by the host 20.

Furthermore, the above embodiment has been described using the NAND flash memory as a nonvolatile memory. However, the nonvolatile memory is not limited to the NAND flash memory. Other types of memories are applicable.

As described above in detail, it is possible to efficiently modify functions of the programs stored in the ROM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
a nonvolatile semiconductor memory; and
a controller coupled to the nonvolatile semiconductor memory, including:
a CPU,
a ROM in which a first firmware is stored, and
a RAM on which the first firmware is loaded to be executed by the CPU,
wherein the controller further includes:
a transfer section which receives, from an outside of the storage device, a command including modifying firmware and an interrupt vector having address information indicating an address on the RAM, and which writes the modifying firmware and the interrupt vector into the nonvolatile semiconductor memory; and
a load section which activates the modifying firmware stored in the nonvolatile semiconductor memory onto the RAM in accordance with the address information of the interrupt vector stored in the nonvolatile semiconductor memory to modify the first firmware.

2. The semiconductor storage device according to claim 1, wherein the nonvolatile semiconductor memory is a NAND flash memory having a plurality of data blocks and at least a management block area.

3. The semiconductor storage device according to claim 2, wherein the modifying firmware and the interrupt vector are stored into the management block area of the NAND flash memory.

4. The semiconductor storage device according to claim 1, wherein the load section activates the modifying firmware in response to a transfer trigger signal detected by the controller.

5. The semiconductor storage device according to claim 2, wherein the management block area has a card information structure page and a plurality of management pages.

6. The semiconductor storage device according to claim 2, wherein the NAND flash memory has an address conversion table in which a physical block address is in correspondence with a virtual physical block address and a virtual logical block address.

7. The semiconductor storage device according to claim 3, wherein the modifying firmware and the interrupt vector are written in the management block area in a lump.

8. The semiconductor storage device according to claim 3, wherein the modifying firmware and the interrupt vector are written in a block in the management block area which has the smallest number of ECC errors.

9. The semiconductor storage device according to claim 1, wherein the first firmware has a function of executing conversion between an address in a first semiconductor memory having a first erase block size assumed by a host and an address in the nonvolatile semiconductor memory having a second erase block size which is different from the first erase block size.

10. The semiconductor storage device according to claim 9, wherein the second erase block size is greater than the first erase block size.

11. The semiconductor storage device according to claim 1, wherein a first page buffer assumed by a host and a second page buffer in the nonvolatile semiconductor memory have different capacities.

12. The semiconductor storage device according to claim 11, wherein the capacity of the second page buffer is greater than that of the first page buffer.

13. The semiconductor storage device according to claim 1, wherein the modifying firmware and the interrupt vector further have at least one of information required to identify the modifying firmware or interrupt vector, information required to identify one or more modules to be modified, information required to identify one or more modules not to be modified, and information indicating a version number and the type of the modification.

14. The semiconductor storage device according to claim 2, wherein when the modifying firmware obtained is a revised version, the transfer section overwrites the corresponding modifying firmware in the management block area with the revised version.

15. The semiconductor storage device according to claim 2, wherein when the modifying firmware obtained is new, the transfer section writes the new modifying firmware in an unused area of the management block area.

16. The semiconductor storage device according to claim 14, wherein the transfer section writes the interrupt vector in the management block area as well as the modifying firmware.

17. The semiconductor storage device according to claim 15, wherein the transfer section writes the interrupt vector in the management block area as well as the modifying firmware.

18. The semiconductor storage device according to claim 1, wherein the modifying firmware is protocol conversion firmware.

19. The semiconductor storage device according to claim 1, wherein the modifying firmware is a CODEC firmware.

20. The semiconductor storage device according to claim 13, wherein the modification is an addition or a subtraction.

* * * * *